United States Patent
Vo

(10) Patent No.: US 7,566,630 B2
(45) Date of Patent: Jul. 28, 2009

(54) BURIED SILICON DIOXIDE / SILICON NITRIDE BI-LAYER INSULATORS AND METHODS OF FABRICATING THE SAME

(75) Inventor: Chanh Q. Vo, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 11/335,071

(22) Filed: Jan. 18, 2006

(65) Prior Publication Data

US 2007/0166948 A1    Jul. 19, 2007

(51) Int. Cl.
*H01L 21/76* (2006.01)

(52) U.S. Cl. .................. 438/423; 257/349; 257/347; 257/E21.32; 257/E21.561

(58) Field of Classification Search .......... 438/406, 438/423; 257/347, 349, E21.32, E21.561
See application file for complete search history.

(56) References Cited

U.S. PATENT DOCUMENTS

| | | | | |
|---|---|---|---|---|
| 5,429,955 A | * | 7/1995 | Joyner et al. | 438/766 |
| 5,518,949 A | * | 5/1996 | Chen | 438/404 |
| 6,031,261 A | * | 2/2000 | Kang | 257/302 |
| 6,069,054 A | * | 5/2000 | Choi | 438/423 |
| 6,489,650 B2 | * | 12/2002 | Kumazaki | 257/318 |
| 6,545,318 B1 | * | 4/2003 | Kunikiyo | 257/349 |
| 6,635,550 B2 | * | 10/2003 | Houston | 438/406 |
| 6,661,065 B2 | * | 12/2003 | Kunikiyo | 257/411 |
| 6,867,104 B2 | | 3/2005 | Stettler et al. | |
| 6,919,238 B2 | | 7/2005 | Bohr | |
| 7,312,132 B2 | * | 12/2007 | Kim | 438/424 |
| 2001/0039098 A1 | * | 11/2001 | Lu | 438/407 |
| 2003/0218212 A1 | * | 11/2003 | Lee et al. | 257/347 |
| 2004/0126990 A1 | * | 7/2004 | Ohta | 438/435 |

* cited by examiner

*Primary Examiner*—Alexander G Ghyka
*Assistant Examiner*—Seahvosh J Nikmanesh
(74) *Attorney, Agent, or Firm*—Blakely, Sokoloff, Taylor & Zafman LLP

(57) ABSTRACT

Embodiments of the present invention relate to the fabrication of a buried bi-layer insulator of silicon oxide and silicon nitride in a microelectronic substrate, and to the buried silicon oxide/silicon nitride bi-layer insulator itself. The buried silicon oxide/silicon nitride bi-layer insulator may be formed by implanting oxygen ions and nitrogen ions into the silicon-containing microelectronic substrate and then annealing the silicon-containing microelectronic substrate to form silicon oxide and silicon nitride layers therein.

20 Claims, 3 Drawing Sheets

US 7,566,630 B2

BURIED SILICON DIOXIDE / SILICON NITRIDE BI-LAYER INSULATORS AND METHODS OF FABRICATING THE SAME

BACKGROUND OF THE INVENTION

1. Field of the Invention

An embodiment of the present invention relates to the fabrication of a microelectronic substrate. In particular, embodiments of the present invention relate to a buried silicon dioxide/silicon nitride bi-layer insulator and methods of fabricating the buried silicon oxide/silicon nitride bi-layer insulator for the fabrication of microelectronic transistors.

2. State of the Art

Buried insulator substrates, such as silicon-on-insulator (SOI) substrates, have become desirable for many microelectronic technologies, including extreme scaling of metal-oxide semiconductor (MOS) and complementary metal-oxide semiconductor (CMOS) devices, advanced MOS junction-type field-effect transistors (MOSFETs), and quantum wires and dots. This is primarily because SOI fabrication processes result in increased packing densities, improved performances, better device isolations, and reduced extrinsic parasitic elements, particularly those of the source and drain, thus significantly speeding up circuit operations.

A typical process for forming a buried insulator may entail implanting oxygen atoms (for example, at a dose between about $2 \times 10^{17}$ to $5 \times 10^{17}$ ions/cm$^2$ and an implantation energy between about 150 to 250 keV) into a silicon substrate to form a high oxygen concentration layer within the silicon substrate. The implanted silicon substrate is then annealed (heated) to the silicon substrate (for example, at a temperature of greater than about 1200 degrees Celsius), which results in the formation of a buried silicon oxide layer.

Although this technique results in a functional buried silicon oxide insulator, the implantation step of the process can result in a substantial amount of micro-defects in the silicon substrate. These micro-defects may lack oxygen atoms (i.e., silicon oxide insulator material) and may provide a path for electric current leakage. This electric current leakage can significantly degrade the performance of a microelectronic device. Thus, there is a need for an improved buried insulator and processes for forming the same.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
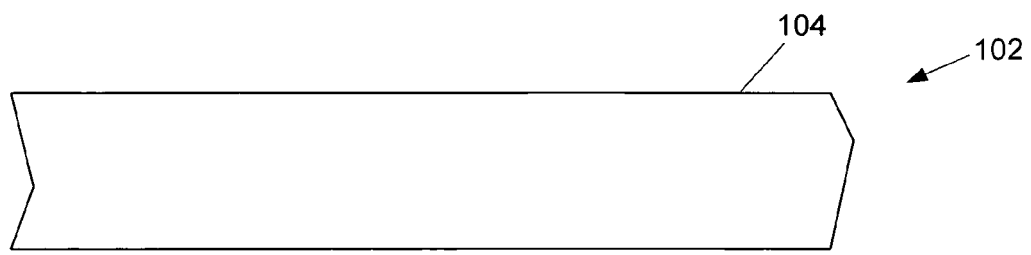
FIG. 1 illustrates a side cross-sectional view of a silicon-containing microelectronic substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of a buried bi-layer insulator of silicon oxide and silicon nitride in a microelectronic substrate, and to the buried silicon oxide/silicon nitride bi-layer insulator itself. The buried silicon oxide/silicon nitride bi-layer insulator may be formed by implanting oxygen ions and nitrogen ions into the silicon-containing microelectronic substrate and then annealing the silicon-containing microelectronic substrate to form silicon oxide and silicon nitride layers therein.

The term "silicon oxide" refers to a compound formed of silicon atoms and oxygen atoms having a general chemical formula of $Si_xO_y$ (wherein x and y are integers), including but not limited to silicon dioxide ($SiO_2$). Additionally, the term "silicon nitride" refers to a compound formed of silicon atoms and nitride atoms having a general chemical formula of $Si_xN_y$ (wherein x and y are integers), including but not limited to $Si_3N_4$. Furthermore, the term "buried" refers to an element or structure formed within a silicon-containing microelectronic substrate and not at a surface of the silicon-containing microelectronic substrate.

Figure 2:
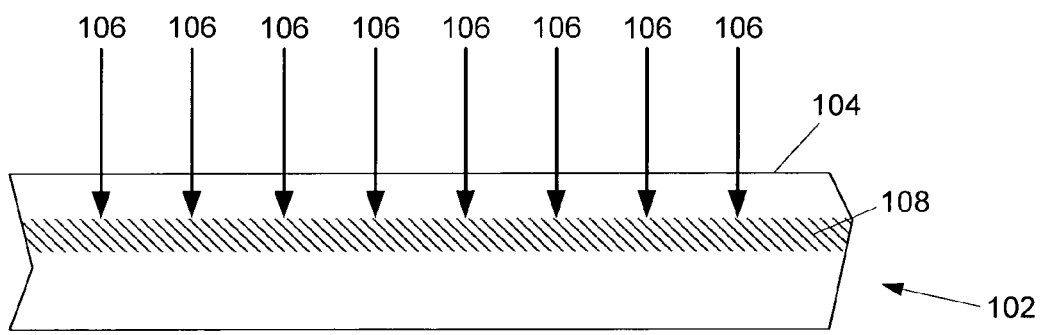
FIG. 2 illustrates a side cross-sectional view of the silicon-containing microelectronic substrate of FIG. 1 having oxygen ions implanted therein to form an oxygen rich layer, according to the present invention.

FIGS. 1-4 illustrate a process for forming a buried bi-layer insulator according to one embodiment of the present invention. A silicon-containing microelectronic substrate 102 having a first surface 104 is provided, as shown in FIG. 1. As illustrated in FIG. 2, oxygen ions (illustrated as arrows 106) are implanted into the silicon-containing microelectronic substrate 102. The silicon-containing microelectronic substrate 102 may include any silicon-containing substrate capable of having integrated circuitry formed therein, including but not limited to a P-type silicon microelectronic wafer, silicon-on-insulator microelectronic wafer, or the like. This implantation may be performed in any equipment known in the art and may include a dose between about $10^{14}$ to $10^{15}$ ions/cm$^2$ and an implantation energy of about 300 keV or greater. In one embodiment, the oxygen ions are implanted at a depth of about 0.25 um from the silicon-containing microelectronic substrate first surface 104. The implantation illustrated in FIG. 2 forms a buried oxygen rich region 108 within the silicon-containing microelectronic substrate 102.

Figure 3:
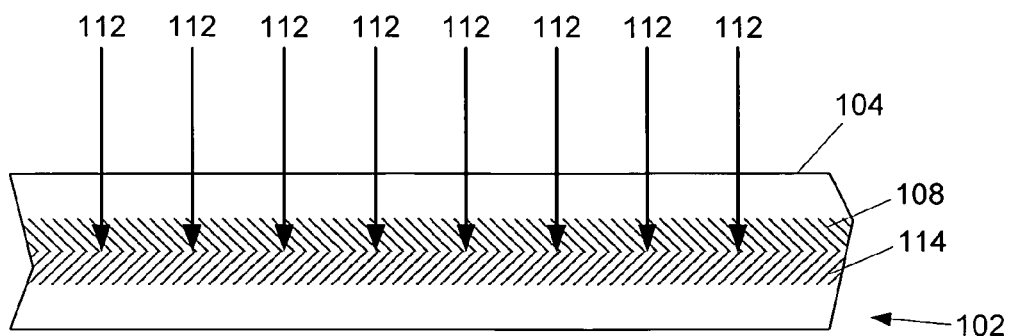
FIG. 3 illustrates a side cross-sectional view of the oxygen implanted, silicon-containing microelectronic substrate of FIG. 2 having nitrogen implanted therein to form a nitrogen rich layer preferably deeper than the oxygen rich layer, according to the present invention.

As illustrated in FIG. 3, nitrogen ions (illustrated as arrows 112) are implanted into the silicon-containing microelectronic substrate 102. This implantation may be performed in any equipment known in the art and may include a dose between about $10^{13}$ to $10^{14}$ ions/cm$^2$ and an implantation energy of about 300 keV or greater. The nitrogen ions are preferably implanted deeper than the buried oxygen rich region 108 and may be at a depth of about 100 angstroms from the silicon-containing microelectronic substrate first surface 104. The implantation illustrated in FIG. 3 forms a buried nitrogen rich region 114 within the silicon-containing microelectronic substrate 102. Generally, it is preferred that the nitrogen ions are implanted deeper than the oxygen ions, as oxygen will gather nitrogen and block nitrogen from moving into the P/N area, as will be understood to those skilled in the art.

In one embodiment, the number of oxygen ions implanted per cubic centimeter within the buried oxygen rich region 108 may be at least five times the number of nitrogen ions implanted per cubic centimeter within the buried nitrogen rich region 114. It is, of course, understood that although dosing levels and implantation energy have been given for the oxygen ion implantation and the nitrogen ion implantation, these parameters can be varied depending on the desired ion concentration and depth.

Figure 4:
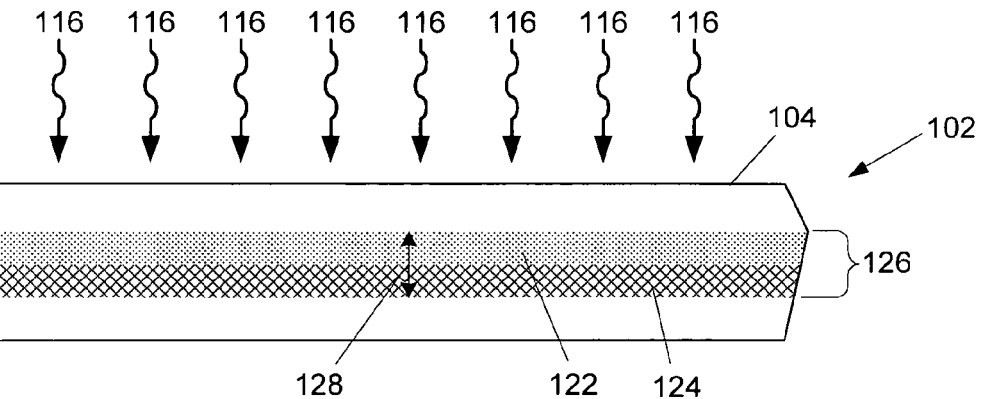
FIG. 4 illustrates a side cross-sectional view of the oxygen/nitrogen implanted, silicon-containing microelectronic substrate of FIG. 3 being annealed (heated) to form a buried silicon oxide/silicon nitride bi-layer insulator, according to the present invention.

After the formation of the buried oxygen rich region 108 and the buried nitrogen rich region 114 of FIG. 3, the oxygen/nitrogen implanted, silicon-containing microelectronic substrate 102 is annealed (heated), which is shown as wavy lines 116 in FIG. 4. In one embodiment of the present invention, the silicon-containing microelectronic substrate 102 is heated to a temperature above about 900 degrees Celsius. This annealing causes a chemical reaction between the implanted oxygen ions within the buried oxygen rich region 108 (see FIG. 3) and the silicon within the silicon-containing microelectronic substrate 102 (also in the buried oxygen rich region 108 (see FIG. 3)) to form a buried silicon oxide layer 122, shown in FIG. 4. Of course, the annealing may also cause a chemical reaction between the implanted nitrogen ions within the buried nitrogen rich region 114 (see FIG. 3) and the silicon within the silicon-containing microelectronic substrate 102 (also in the buried nitrogen rich region 114 (see FIG. 3)) to form a buried silicon nitride layer 124, shown in FIG. 4. The buried silicon oxide layer 122 and the buried silicon nitride layer 124 are hereinafter referred to collectively as a buried silicon oxide/silicon nitride bi-layer insulator 126. A combined thickness 128 of the buried silicon oxide/silicon nitride bi-layer insulator 126 may be approximately 1000 angstroms or greater.

Figure 5:
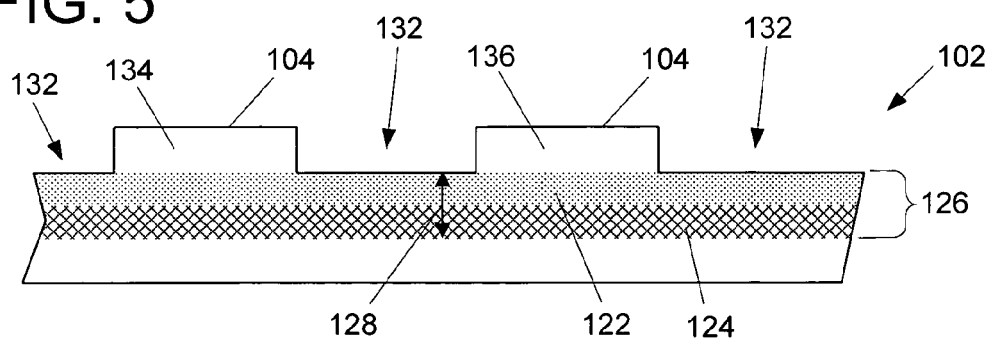
FIG. 5 illustrates a side cross-sectional view of the silicon-containing microelectronic substrate of FIG. 4 after patterning and etching to form unimplanted microelectronic substrate material structures above the buried silicon oxide/silicon nitride bi-layer insulator, according to the present invention.

The silicon-containing microelectronic substrate 102 may then be patterned and etched, by any process known in the art, from the silicon-containing microelectronic substrate first surface 104 to the buried silicon oxide/silicon nitride bi-layer insulator 126 to form at least one opening 132 and silicon-containing plateaus from the unimplanted silicon-containing microelectronic substrate material, such as first silicon-containing structure 134 and second silicon-containing structure 136, as shown in FIG. 5. It is understood that the terms "etched" and "etching" includes, but is not limited to, removing of selected material areas, and may include either wet etching and dry etching techniques, as known in the art. It is also understood that the term "patterned" and "patterning" refers to any method of protecting desired areas from the etching process.

Figure 6:
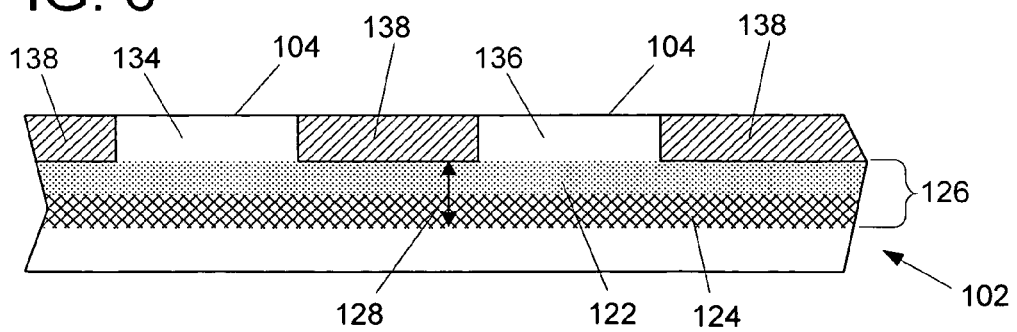
FIG. 6 illustrates a side cross-sectional view of the silicon-containing microelectronic substrate of FIG. 5 having a dielectric material disposed proximate at least a portion of each of the unimplanted substrate material structures to assist in electrically isolating the unimplanted microelectronic substrate material structures from one another, according to the present invention.

The openings 132 may then be filled with a dielectric material, such as silicon oxide and the like, by any method known in the art, including but not limited to chemical vapor deposition, sputtering, spin on deposition, and the like. The dielectric material may then be planarized to form isolation structures 138, as shown in FIG. 6. These isolation structures 138 assist in electrically isolating the unimplanted silicon-containing plateaus, such as first silicon-containing structure 134 and second silicon-containing structure 136, from one another.

Figure 7:
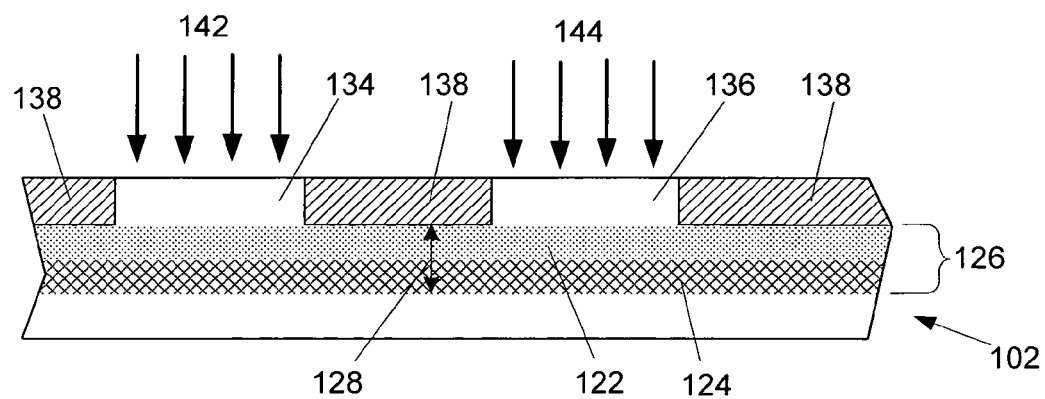
FIG. 7 illustrates a side cross-sectional view of the microelectronic substrate of FIG. 6 having the unimplanted microelectronic substrate material structures being implanted to be p-type or n-type, according to the present invention.
Figure 8:
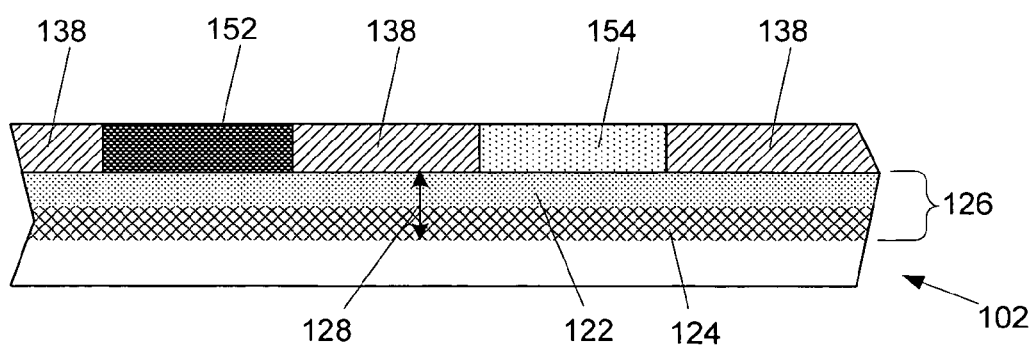
FIG. 8 illustrates a side cross-sectional view of the microelectronic substrate of FIG. 7 after implantation, according to the present invention.

As shown in FIG. 7, the first silicon-containing structure 134 may be implanted with an n-type dopant, illustrated as arrows 142 and the second silicon-containing structure 136 may be implanted with a p-type dopant, illustrated as arrows 144. The resulting structure is shown in FIG. 8 with a resulting doped first silicon-containing structure 152 and a doped second silicon-containing structure 154. The doped first silicon-containing structure 152 and the doped second silicon-containing structure 154 may be activated, such as by annealing, to form transistor sources and/or drains, as will be understood by those skilled in the art. It is, of course, understood that various structures may be formed and various process steps may be conducted prior to and after the formation of the sources and drains. It is also understood that these structures can be implemented in a variety of transistor structures.

The buried silicon oxide/silicon nitride bi-layer insulator of the present invention eliminates a substantial amount of drain and/or source to substrate leakage current. A resulting microelectronic transistor using the buried silicon oxide/silicon nitride bi-layer insulator of the present invention can run at higher temperatures with less speed degradation and lower current requirements, as well as lower standby current, compared to microelectronic transistors without such a buried silicon oxide/silicon nitride bi-layer insulator. Furthermore, a substantial amount of junction capacitance around source and drain is also substantially reduced, which allows for increased speed, as will be understood by those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic structure, comprising:
   providing a microelectronic substrate;

implanting oxygen ions into said microelectronic substrate to form a buried oxygen rich region within the microelectronic substrate;

implanting nitrogen ions into said microelectronic substrate to form a buried nitrogen rich region within the microelectronic substrate, wherein implanting nitrogen ions comprises implanting said nitrogen ions farther from a first surface of said microelectronic substrate than the implanting of said oxygen ions;

annealing said buried oxygen rich region to form a buried silicon oxide layer; and annealing said buried nitrogen rich region to form a buried silicon nitride layer.

2. The method of claim 1, wherein annealing said buried oxygen rich region and annealing said nitrogen rich region occur substantially simultaneously.

3. The method of claim 2, wherein said substantially simultaneous annealing comprised heating said microelectronic substrate to a temperature above about 900 degrees Celsius.

4. The method of claim 1, wherein a combined thickness of said buried silicon oxide layer and said buried silicon nitride layer is greater than about 1000 angstroms.

5. The method of claim 1, wherein implanting oxygen ions into said microelectronic substrate comprises implanting oxygen ions at a per cubic centimeter concentration of at least five times greater than a concentration of said implanted nitrogen ions.

6. The method of claim 1, further comprising etching at least one opening into said microelectronic substrate from a first surface of said microelectronic substrate to said buried silicon oxide layer.

7. The method of claim 6, further comprising disposing a dielectric material within said at least one opening.

8. The method of claim 6, wherein etching said at least one opening into said microelectronic substrate forms at least one silicon-containing structure.

9. The method of claim 7, further comprises implanting said silicon-containing structure with a dopant.

10. A buried insulator, comprising:
a buried silicon oxide layer within a microelectronic substrate; and
a buried silicon nitride layer within said microelectronic substrate, wherein said silicon nitride layer is adjacent to and farther from a first surface of said microelectronic substrate than said silicon oxide layer.

11. The buried insulator of claim 10, wherein a combined thickness of said buried silicon oxide layer and said buried silicon nitride layer is greater than about 1000 angstroms.

12. A microelectronic structure formed by a method comprising:
providing a microelectronic substrate;
implanting oxygen ions into said microelectronic substrate to form a buried oxygen rich region within the microelectronic substrate;
implanting nitrogen ions into said microelectronic substrate to form a buried nitrogen rich region within the microelectronic substrate, wherein implanting nitrogen ions comprises implanting said nitrogen ions farther from a first surface of said microelectronic substrate than said implanting of said oxygen ions;
annealing said buried oxygen rich region to form a buried silicon oxide layer; and
annealing said buried nitrogen rich region to form a buried silicon nitride layer.

13. The microelectronic structure of claim 12, wherein annealing said buried oxygen rich region and annealing said nitrogen rich region occur substantially simultaneously.

14. The microelectronic structure of claim 13, wherein said substantially simultaneous annealing comprised heating said microelectronic substrate to a temperature above about 900 degrees Celsius.

15. The microelectronic structure of claim 12, wherein a combined thickness of said buried silicon oxide layer and said buried silicon nitride layer is greater than about 1000 angstroms.

16. The microelectronic structure of claim 12, wherein implanting oxygen ions into said microelectronic substrate comprises implanting oxygen ions at a per cubic centimeter concentration of at least five times greater than the concentration of said implanted nitrogen ions.

17. The microelectronic structure of claim 12, further comprising etching at least one opening into said microelectronic substrate from a first surface of said microelectronic substrate to said buried silicon oxide layer.

18. The microelectronic structure of claim 17, further comprising disposing a dielectric material within said at least one opening.

19. The microelectronic structure of claim 17, wherein etching said at least one opening into said microelectronic substrate forms at least one silicon-containing structure.

20. The microelectronic structure of claim 19, further comprises implanting said silicon-containing structure with a dopant.

* * * * *